United States Patent [19]
Roth

[11] Patent Number: 5,550,069
[45] Date of Patent: Aug. 27, 1996

[54] METHOD FOR PRODUCING A PMOS TRANSISTOR

[75] Inventor: Walter Roth, Dortmund, Germany

[73] Assignee: El Mos Electronik In Mos Technologie GmbH, Dortmund, Germany

[21] Appl. No.: 432,759

[22] Filed: May 2, 1995

Related U.S. Application Data

[63] Continuation of Ser. No. 971,913, filed as PCT/EP91/01157, Jun. 22, 1991 published as WO92/00608, Jan. 9, 1992, abandoned.

[30] Foreign Application Priority Data

Jun. 23, 1990 [DE] Germany ............................ 40 20 076.0

[51] Int. Cl.⁶ ................................................. H01L 21/265
[52] U.S. Cl. ................................. 437/41; 437/547; 437/44
[58] Field of Search .......................... 437/29, 37, 41 GS, 437/909, 947, 41 AS, 44; 257/336, 344, 346; 148/DIG. 82, DiG. 141, DIG. 161

[56] References Cited

U.S. PATENT DOCUMENTS

| | | | |
|---|---|---|---|
| 3,707,765 | 1/1973 | Coleman | 437/37 |
| 3,906,620 | 9/1975 | Anzai et al. | 148/DIG. 141 |
| 4,190,850 | 2/1980 | Tihanyi et al. | 257/336 |
| 4,380,489 | 4/1983 | Beinvogl et al. | 156/643 |
| 4,404,576 | 9/1983 | Ronen | 257/336 |
| 4,436,584 | 3/1984 | Bernacki et al. | 156/643 |
| 5,100,820 | 3/1992 | Tsubone | 257/344 |
| 5,177,571 | 1/1993 | Satoh et al. | 257/336 |

FOREIGN PATENT DOCUMENTS

| | | |
|---|---|---|
| 2216676 | 11/1973 | France . |
| 2331884 | 11/1976 | France . |
| 2636214 | 3/1977 | Germany . |
| 62-245675 | 4/1988 | Japan . |

OTHER PUBLICATIONS

Stanley Wolf and Richard N. Tauber, Silicon Processing for the VLSI ERA pp. 321–327 (1986).
Tapered Photoresist for a Doping Profile, vol 26, No. 6, IBM Technical Disclosure Bulletin 2682, 2682–2683 (1983).
Badami, D. A., et al., "Tapered Photoresist For a Doping Profile", IBM Technical Disclosure Bulletin, vol. 26, No. 6, Nov. 1983, New York, pp. 2682–2683.

Primary Examiner—Mary Wilczewski
Assistant Examiner—Brian K. Dutton
Attorney, Agent, or Firm—Loeb & Loeb LLP

[57] ABSTRACT

A method for producing a PMOS transistor. A p doped substrate and an n doped trough are provided by implantation and subsequent diffusion. The transistor is insulated by means of a field oxide layer. The transistor gates are produced using a photolithographic pattern. The photoresist left from the photolithographic pattern after the gate is etched is used as the mask of the drain region at the gate-side end for at least one p⁻ implantation. The thickness of the edge of the photoresist layer decreases towards the surface of the drain region at the gate edge. Due to this decreasing thickness, when the implant is introduced the flank (17, 19) of the implantation concentration profile (16, 18) is deflected towards the channel below the gate region.

19 Claims, 1 Drawing Sheet

METHOD FOR PRODUCING A PMOS TRANSISTOR

This is a continuation of application Ser. No. 07/971,913, filed as PCT/EP91/01157, Jun. 22, 1991, published as WO92/00608, Jan. 9, 1992, now abandoned.

BACKGROUND OF THE INVENTION

1. Field of the Invention

The invention relates to a method for producing a PMOS transistor, as well as to a PMOS transistor.

2. Description of Related Art

In the field of automobile electronics and industrial electronics, use is often made of circuits that are operated at voltages about 24 Volts. Such circuits are readily realized by employing discrete transistors. With monolithically integrated solutions, conventional technologies (TTL, CMOS, NMOS) entail problems with the dielectric strength of the integrated transistors. This is partly due to the fact that the manufacturing processes have been designed for an operating voltage of about 5 Volts, and partly to the fact that small component geometries and low parasitic resistances are desired.

In order to also satisfy the demand for circuits of higher dielectric strength, rather complex production methods have been developed, such as the BICMOS production method which allows the production of small transistors of low dielectric strength, as well as transistors of great dielectric strength up to a dielectric strength of about 40 to 60 Volts, e.g., output drivers of average capacity. For a BICMOS production process that provides bipolar and CMOS components, about 17 mask planes are required so that the production costs for such a circuit are about twice those of the production process for a standard CMOS circuit.

The CMOS production process developed by ELMOS, Dortmund, allows an operating voltage of up to 12 Volts, due to particularly favorable doping arrangements of the drain diodes. The NMOS transistors produced according to that method, however, are only of limited use for open drain outputs. A dielectric strength of more than 10 Volts would be of particular interest for automobile electronics.

A known method for increasing the dielectric strength of MOS transistors consists in decreasing the drain doping. The best known method is the so-called lightly-doped drain (LDD) with its technological variations. Mostly, these are self-adjusting methods. For example, both sides of the gate are provided with a spacer bar or spacer. Then, a small dosage is implanted. This doping is diffused so deep that the lateral underdiffusion reaches the gate. In the next step, the high drain-source dosage is implanted and annealed. Under the spacer, a region of weak doping, i.e. the desired LDD, is obtained.

The advantage of this method is in the self-adjustment. The width of the leakly doped drain region is determined exclusively by the depth of the first diffusion, the width of the spacer, as well as the depth of the drain source diffusion. No adjustment tolerances occur. Thus, the method is particularly suited for smaller transistors with channel lengths in the range of 1 μm and spacer lengths in the range of 0.5 μm. Because of the limited width of the weakly doped region (about 0.8 μm maximum), the method is not suitable to achieve dielectric strengths of about 30 Volts.

From EP-A 0 148 342, a method is known for simultaneously producing fast short channel and dielectrically strong MOS transistors in VLSI circuits, which allows the simultaneous production of both short channel transistors with high switching speeds and a supply voltage of 5 Volts, as well as analogue transistors with a drain voltage of up to 12 Volts, but with a slower switching speed, the production requiring the least possible number of additional steps. These known transistors do not achieve a dielectric strength beyond 12 Volts either.

The presently known methods are comparatively complex in their technical efforts and, what is most important, they change the time-temperature budget of a CMOS production process so that the production of dielectrically strong semiconductor elements are not compatible with the standard CMOS production process. Therefore, the known methods cannot readily be integrated into an existing production process.

From U.S. Pat. No. 4,908,326, a method for producing a MOS structure is known wherein the spacer is designed with a particular contour for the ion implants.

It is an object of the present invention to provide a method for producing a PMOS transistor with which an extremely high dielectric strength may be obtained without substantial additional efforts in the production process, while maintaining full compatibility with a standard CMOS production process, as well as to provide a PMOS transistor having an extremely high dielectric strength.

SUMMARY OF THE INVENTION

To solve the object, a method is provided in accordance with the present invention for producing a PMOS transistor in a p doped substrate by producing an n doped trough by implanting and subsequent diffusing, by producing the source, drain and gate regions, as well as the intermediate and insulating oxide according to method steps known in MOS technology, the masking for the ion implants being provided by photolithographic patterns, and by insulating the transistor by means of a field oxide layer or by a dielectric insulation (SOI technology), that, the remaining photoresist of the photolithographic pattern after the etching of the gate is used as the masking of the drain region at the gate-side end for at least one $p^-$ implant, an edge that falls towards the surface of the drain region being provided in the photoresist layer at the gate edge such that the photoresist layer has a thickness decreasing towards the gate edge, the flank of the implant concentration profile being deflected towards the channel below the gate region because of the falling edge when the implant is introduced.

The PMOS transistor in a p doped substrate with an n doped trough in which a source and a drain extend, an insulation consisting of a field oxide layer, and a gate oxide layer extending between the source and the drain and having a superimposed gate is characterized in that the $p^+$ region of the drain is withdrawn from the gate edge and that at least one weakly doped implant overlaps with the gate, the flanks of the maximum doping concentration line being inclined towards the gate.

The invention provides a PMOS transistor wherein, in particular at drain voltages above 20 Volts, the gate oxide is effectively unburdened so that no long-term damage or even dielectric breakthroughs can occur there. The PMOS transistor obtained with the production method of the invention has a dielectric strength of about 50 Volts, the production process for such a PMOS transistor being fully compatible with the standard process. The reason for the compatibility lies in the fact that the temperature-time parameters of the production process that determine the diffusion processes need only be altered to a negligible extent, if at all. Concerning the basic doping processes, it may be stated for the PMOS transistor of the invention that soft weakly doped p-n junctions with the largest possible rounding radii yield a good dielectric strength. According to the present invention, this principle is realized by a downwardly sloped edge of the photoresist, which causes a masking with a varying filter effect so that, in the junction, the bombardment with boron ions is not completely absorbed, but a part of it penetrates the same and reduces the steepness of the flanks of the weakly doped drain region. Thus, this achieves a distribution of the voltage drop over a longer distance so that the dielectric strength is increased. Besides the increase of the dielectric strength, it is also possible to reduce the dimensions of the semiconductor structures, in particular the channel length.

In order to increase the dielectric strength of the drain diode, a deep ion implant is driven beneath the $p^+$ region of the drain. Here, the implantation profile is partly overlapped with the gate due to lateral scattering. The $p^+$ region of the drain is withdrawn from the gate end so that the drain-gate voltage may be dissipated in part along a space-charge region in the weakly doped drain region. It is important that the flank of the implantation profile is inclined towards the gate, and that the maximum concentration is not achieved at the surface, but at a depth of about 0.5 µm. Thus, an effective unburdening of the gate oxide is achieved so that, eventually, an increase in the dielectric strength of the drain diode to about 50 Volts is obtained.

Preferably it is provided that immediately after the first deep ion implant beneath the $p^+$ region of the drain, a second implant is driven above the depth of the p implantation, the depth of the second implantation being reduced compared to the first implantation. The second ion implantation attenuates the effect of the so called pinch resistor that increases the on resistance as a series resistor to the transistor. The dosage of the second implantation is chosen such that a transistor breakthrough voltage above 40 Volts is maintained.

An embodiment of the invention provides that the photoresist left on the gate after the gate etching is polymerized for about 1 hour at about 160° C. for stabilization. Thereafter, the resist is completely polymerized and relatively insensitive to solvents and developing agents.

The thicker the photoresist is applied, the higher the acceleration voltages for the ion bombardment may be set and the deeper the implant may be driven.

In order to achieve a reliable masking, a silicon oxide layer may be used in addition to the photoresist.

BRIEF DESCRIPTION OF THE DRAWINGS

The following is a detailed description of an embodiment of the present invention taken in conjunction with the accompanying drawings.

The Figures show.

DESCRIPTION OF THE PREFERRED EMBODIMENTS

Figure 1:
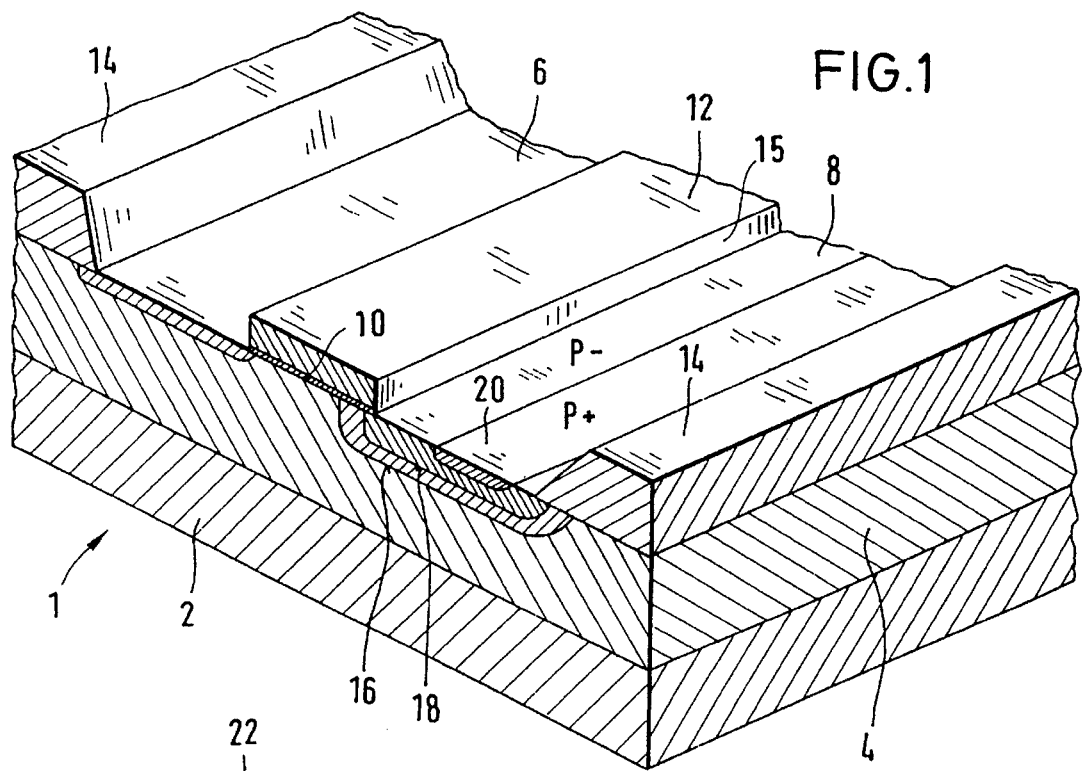
FIG. 1 - a perspective sectional view of the PMOS transistor of the invention.

FIG. 1 shows a perspective view, partially in section, of a PMOS transistor 1 in a p doped substrate 2 of silicon, the transistor being embedded in an n doped trough 4. The n doped trough 4 contains a p doped source 6 and a p doped drain 8. Disposed between the source and the drain, there is the gate oxide 10, e.g. a silicon dioxide layer of a thickness of 45 nm, and, over the same, the gate 12 of polysilicon with a layer thickness of about 450 nm is arranged. At the ends of the source an drain averted from the gate 12, a respective field oxide layer 14 of a thickness of 800 nm is applied for insulating purposes. Over the same, a passivation layer (not illustrated) may be arranged additionally.

In section, the drain shows a triple implantation. The first deep implantation 16 of boron ions has a depth of about 0.8 µm; while the second implantation 18 reaches a depth of about 0.4 µm.

The $p^+$ implantation 20 of the $p^+$ drain doping is effected last and is spaced both from the gate 12 and from the field oxide layer 14.

Figure 2:
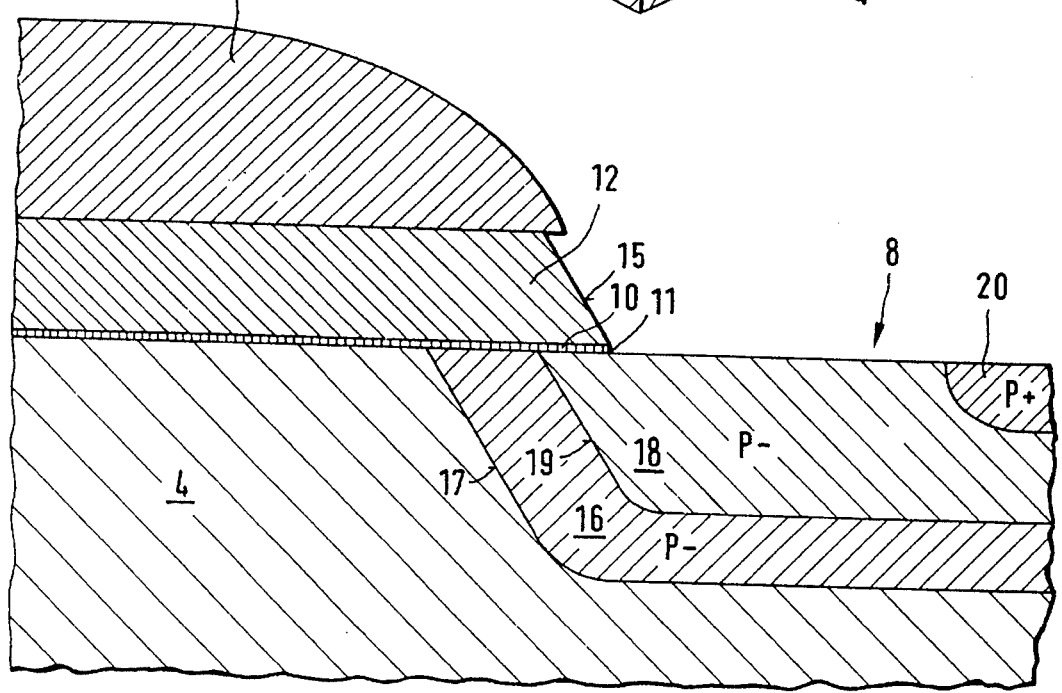
FIG. 2 - a section of the drain at its gate-side end.

FIG. 2 shows the gate-side end of the drain 8, the $p^+$ implantation 20 being spaced from the gate edge.

FIG. 2 shows a photoresist layer 22 above the gate 12, which is flattened towards the gate edge 11, i.e. which has a decreasing thickness. The flattening may be arcuate, as shown in FIG. 2, but also stepped and it may start at a distance from the gate edge 11 that preferably lies in thE range between half and twice the layer thickness of the photoresist layer 22. The decreasing thickness of the photoresist layer results in an inclined flank shown by the lines 17, 19 of maximum doping concentration in the overlapping region of the lateral underdiffusion of the double implantations with the gate 12 and prevents a steep flank of the lines 17, 19 since the intensity of the boron bombardment in the edge region of the gate 12 does not change abruptly.

Different from FIG. 1, the gate flank 15 may extend at an angle of e.g. 60° to the surface of the drain 8 so as to provide an additional gate-side shift of the line of maximum concentration of the lateral scattering and to increase the effect described in connection with the profiling of the photoresist, both being effected during the boron ion implants 16 and 18 in the overlapping region of the drain and the gate. The border lines 17, 19 of the implantations 16 and 18 shown in FIGS. 1 and 2, are lines of maximum concentration.

Compared to the standard CMOS production process, the increase of the dielectric strength additionally requires a photolithographic process step and the double implantation already described. The temperature and time parameters of the diffusions are not changed so that the full compatibility with the standard process is maintained. The transistor is constructed as follows:

The source side and the threshold voltage setting are the same as in the standard transistor. In order to increase the dielectric strength of the drain diode, the deep boron ion implant 16 (350 keV, $1.5 \times 10^{12}$ cm$^{-2}$ with a peak depth of about 0.8 µm) is driven under the p region 20 of the drain 8. This causes an increase of the dielectric strength of the drain diode up to about 50 Volts. The $p^+$ region 20 of the drain 8 is withdrawn from the gate end so that the drain gate voltage may be dissipated in part along a space-charge region in the weakly doped drain region 16, 18. This results in an effective unburdening of the gate oxide 10.

However, the disadvantage of the so-called pinch resistor thus obtained is that it increases the on resistance as a series resistor to the transistor. In order to attenuate this effect, the second implantation 18 is driven over the deep $p^-$ implantation 16. The dosage is selected such that a transistor breakthrough voltage above 40 Volts is maintained. The implantation depth of about 0.4 µm has the effect that the boron concentration immediately below the gate oxide 10 remains low, yet it also provides that the deep implantation profile with a peak depth of 0.8 µm, which is required for the dielectric strength of the diode, remains undisturbed.

In order to achieve an optimum adjustment of the two additional implantations 16, 18 with respect to the gate edge 11, a self-adjusting process control is employed. This control provides for a safe overlapping of the gate 12 with the implantation profiles ending at the gate edge 11. This process control allows the positioning of the weakly doped trailing ends of the two implantation profiles beneath the gate end, thereby making it possible to obtain the required dielectric strength.

For the production of HV-PMOS transistors, the standard process is supplemented as follows:

After the etching of the polysilicon, the photoresist 22 is left on the polysilicon of the gate 12. In order to stabilize the resist, the wafer discs are annealed for one hour at 160° C. Thereafter, the resist ie entirely polymerized and relatively insensitive to solvents and developing agents. Now, an additional, new layer of photoresist is applied. This resist is exposed and developed with the mask for the p⁻ drain regions. The openings in the mask overlap the drain regions all around by about 3 µm so that it is ensured that all p⁺ regions are afterwards enclosed by a p⁻ region. The gate-side border of the implantation region is formed by the polysilicon gate with the resist left thereon. Into this opening, the flat and the deep p⁻ drain implantations 16, 18 are driven one immediately after the other in optional sequence. Thereafter, the resist is removed completely. In the next photolithographic process step, which already is part of the standard CMOS process, the p⁺ drain region 20 is defined (mask P). The p⁺ drain region 20 starts at a distance of at most 3 µm from the gate 12. Since the mask must be adjusted, this distance depends on the accuracy of the adjustment and on the dimensional accuracy of the image. Therefore, a safety tolerance for adjustment errors must be provided in addition to the space of about 1.5 µm required by the space-charge region.

After the implantation of the p⁻ drain doping, the high voltage PMOS production process corresponds to the standard process again. Since in the p⁺ implantation only the polysilicon layer with a layer thickness of 450 nm is present as a mask of the PMOS channels, this implantation must be carried out with B+.

The p⁻ layer produced by the two p⁻ drain implantations also allows to produce high-ohmic resistors, e.g. of 6 kΩ/□, npn bipolar transistors, p channel J-FETs, as well as to obtain threshold voltage increases of metal field transistors or improvements of the contact resistances of substrate contacts.

What is claimed is:

1. A method for producing a PMOS transistor, comprising:

providing a p doped substrate, providing an n doped trough on at least a portion of the p doped substrate, providing a source and a drain extending in the n doped trough, providing an insulation layer comprising field oxide on at least a portion of the n doped trough, providing a gate oxide layer extending between the source and the drain, forming a gate on the gate oxide layer, the gate defining a gate edge, providing a photolithographic pattern on the gate including a photoresist layer as a mask for ion implantation, shaping the photoresist layer so that the thickness of the photoresist layer near the gate edge diminishes towards the drain, forming at least one weakly doped implantation region in overlapping relationship with the gate using the shaped photoresist layer as a mask, the trough and the at least one weakly doped implantation region defining at least one flank having a doping concentration, the diminishing thickness of the photoresist layer causing the at least one flank having a doping concentration to define a border that is inclined toward the gate.

2. The method of claim 1, further comprising implanting a p-type conductive impurity to a final depth of the doping through the mask.

3. The method of claim 2 wherein the p-type conductive impurity comprises boron.

4. The method of claim 1, wherein forming at least one weakly doped impurity region comprises forming a first implantation region having a dosis equal to approximately $1.5 \times 10^{12}$ cm$^{-2}$ and an energy equal to approximately 350 keV.

5. The method of claim 4, wherein the first implantation region defines a depth, and comprising:

forming a second implantation region above the first implantation region immediately after forming the first implantation region, the second implantation region having a depth which is less than the depth of the first implantation region.

6. The method of claim 5, comprising forming the first implantation region to a maximum depth of approximately 0.8 µm, and forming the second implantation region to a maximum depth of approximately 0.04 µm.

7. The method of claim 1, wherein the photoresist layer has a thickness of between approximately 0.8 µm and approximately 1.5 µm.

8. The method of claim 7 wherein the photoresist layer has a thickness of approximately 1.1 µm.

9. The method of claim 1, wherein the photolithographic pattern includes a photoresist layer and a silicon oxide layer.

10. The method of claim 1, comprising polymerizing the photoresist layer for approximately 1 hour at approximately 160° C. prior to an ion implantation.

11. The method of claim 1, wherein the mask edge and the gate edge are mutually spaced by a distance of at least approximately 0.5 µm.

12. The method of claim 11, wherein the mask edge and the gate edge are mutually spaced by a distance of between approximately 1.5 µm and approximately 3 µm.

13. The method of claim 1, comprising implanting a p-type conductive impurity through an opening in the mask that is smaller than the drain region.

14. The method of claim 13, wherein the drain region comprises a field oxide having at least one dimension, wherein the at least one dimension of the field oxide of the drain region is defined using a mask opening, wherein the drain region defines a first size, wherein the mask opening defines a second size, and wherein the second size is larger than the first size.

15. The method of claim 1, wherein the drain region defines a border with the field oxide, wherein the border defines a first dimension, wherein the mask defines a second dimension, and wherein the second dimension is smaller than the first dimension by a distance of between approximately 1.5 μm and approximately 3.0 μm.

16. The method of claim 1, wherein the gate defines a flank, wherein the drain defines a surface, and wherein the flank of the gate and the surface of the drain mutually define an angle of between approximately 30° and approximately 75°.

17. The method of claim 16, wherein the flank of the gate and the surface of the drain mutually define an angle of approximately 60°.

18. The method of claim 16, wherein the photoresist layer defines an edge and the gate defines a flank having an upper end, and wherein the edge of the photoresist layer and the upper end of the gate flank are in mutually overlapping relationship.

19. The method of claim 1, further comprising isolating the transistor using a dielectric insulating layer.

* * * * *